United States Patent [19]
Cassidy

[11] Patent Number: 5,446,394
[45] Date of Patent: Aug. 29, 1995

[54] TEST FIXTURE WITH PERMANENT CIRCUIT BOARD EXTRACTOR THEREON

[75] Inventor: Michael P. Cassidy, Chandler, Ariz.
[73] Assignee: VLSI Technology, Inc., San Jose, Calif.
[21] Appl. No.: 189,868
[22] Filed: Feb. 1, 1994
[51] Int. Cl.⁶ .......................... H01R 13/62; G01R 1/04
[52] U.S. Cl. ................................... 324/762; 439/157; 439/188
[58] Field of Search ............... 439/188, 160, 153, 157; 324/754–762

[56] References Cited

U.S. PATENT DOCUMENTS 5,232,375 8/1993 Todd ................................... 439/157

OTHER PUBLICATIONS

Research Disclosure; anonymous; vol. 309; Jan. 1990; p. 34; item 30957.

Primary Examiner—Kenneth A. Weider
Assistant Examiner—Barry C. Bowser
Attorney, Agent, or Firm—LaValle D. Ptak

[57] ABSTRACT

A circuit board extractor particularly suitable for extracting "burn-in" boards from a test fixture is attached to the front of the test fixture between the tester connector assembly and the burn-in board, or burn-in board frame rails, for movement of a movable member between first and second positions. The first position of the movable member occurs when the pin connectors on the edge of the burn-in board are inserted into corresponding pin receptacles on the front of the test fixture. Movement of the movable member from the first position thereof to its second position pushes the burn-in board away from the front of the test fixture to cause withdrawal of the pin connectors on the edge of the burn-in board from the pin receptacles on the edge of the test fixture without damaging the burn-in board or the test fixture.

8 Claims, 1 Drawing Sheet

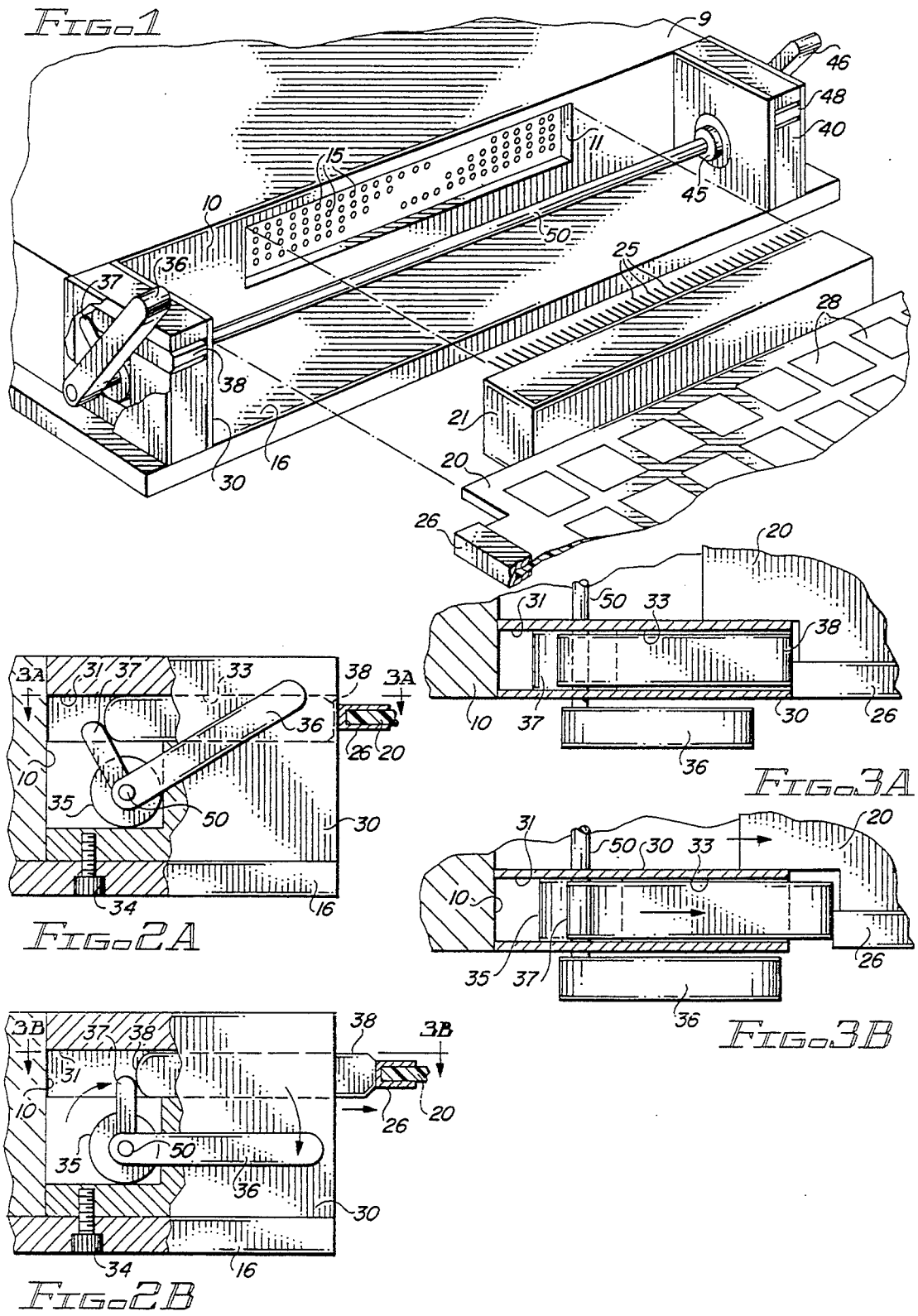

TEST FIXTURE WITH PERMANENT CIRCUIT BOARD EXTRACTOR THEREON

BACKGROUND

Integrated circuits currently are manufactured in compact packages including thousands, and even millions, of transistors and other components fabricated on semi-conductor wafers, connected to lead frames and potted in packages from which a large number of leads extend. Large scale integrated circuits and very large scale integrated circuits (LSI and VLSI circuits) result in complete electronic systems or major parts of complex electronic systems, all packaged in relatively small-sized integrated circuit packages. These circuit packages sometimes are used alone as the electronic "heart" of a system or device, or are interconnected together as part of a larger system in which more than one LSI or VLSI integrated circuits are used.

It is very important for integrated circuits to operate properly for their intended purposes once they are shipped from the manufacturing facility, since, if such circuits are incorporated into other devices, failure of the circuit to properly function could result in the failure of a much more expensive device or system into which the circuits are incorporated. It has been found, that if an LSI circuit or VLSI circuit is defective in some way which may cause it to fail, the failure usually occurs within the initial hours of operation. Once some pre-established minimum number of hours of proper operation takes place, the circuit typically does not fail; unless of course it is subjected to some type of catastrophic surge voltage, or the like.

In order to ensure that integrated circuit packages, which are shipped to customers for incorporation into finished products, will operate properly in those finished products, it is a common practice to operate the finished, packaged integrated circuits for a period of time under power. This is done to cause any failures which are likely to occur to occur before the integrated circuit packages are shipped. To do this, several integrated circuit packages are interconnected into receptacles on relatively large "burn-in" printed circuit boards, which have printed circuit interconnections going to each of the receptacles for each of the integrated circuits to be operated on the board. The circuit leads for each of the different receptacles extend to one edge of the board, where they terminate in a connector block having a large number of pin connectors extending from it. The different pin connectors each are connected to different ones of the printed circuit leads, connected to the sockets for the different integrated circuits to undergo test.

Burn-in boards can have hundreds of connector pins on the connector block. These pins are physically aligned with a corresponding group of pin receptacles on the front of a tester, which then provides the operating power and signals to the pins in accordance with the devices undergoing test. Thus, to effect a "burn-in" of a number of LSI or VLSI circuits, the circuits are mounted in the receptacles on an appropriate burn-in board designed to operate those particular circuits. That burn-in board is plugged into the tester, which is programmed to operate the desired burn-in test for the integrated circuit packages which are to undergo test.

The printed circuit burn-in board typically is mounted on a frame; and the board is moved toward the test fixture with the pin connectors aligned with the corresponding pin receptacles on the test fixture. Usually, the board is manually inserted into the test fixture; so that all of the pin connectors are seated firmly into the receptacles on the test fixture. Each pin makes a friction fit engagement into the receptacle into which it is placed, to cause good electrical interconnection to take place between the tester receptacles and the pins connected to the printed circuit wiring on the printed circuit burn-in board.

In the past, when a different burn-in board is to be used with the test fixture, it is necessary to remove whichever burn-in board is in place by withdrawing it from the test fixture prior to insertion or interconnection of a new board. Because each of the pin connectors makes a friction fit with the receptacle into which it is inserted, some force is required to withdraw each pin from the receptacle. When only a small number of pins and a correspondingly small number of receptacles are involved, the force is not great; and pin separation readily, manually, can be accomplished. For the testing of a large number of LSI of VLSI integrated circuit packages, however, the number of pins inserted into the corresponding number of receptacles may extend into the hundreds. A typical commercial tester or test bench may include as many as four hundred sixteen pins and receptacles for interconnection. The result is a significant amount of withdrawal force is encountered when the burn-in test board is to be withdrawn or removed from the tester or test fixture.

In the past, it has been common for test engineers to carefully insert a screwdriver between the edge of the printed circuit burn-in board and the front of the tester to pry the burn-in board away from the tester. Usually, the screwdriver is inserted first on one side to move that side out a short distance, and then is moved to the opposite side of the test board to pry that side outwardly. This operation is alternated until the board is loose enough to be withdrawn by hand from the test fixture. A problem with the use of a screwdriver or similar tool to pry the burn-in board or other test board away from the test fixture is that the pressure of the screwdriver between the edge of the board and the front of the tester may cause damage to one or the other or both of these components. In addition, the prying, first of one side and then the other, causes a strain on the pin connectors, tending to bend them first in one direction or the other. A similar strain, which may result in misalignment of pin connectors, occurs when the test board is grasped on opposite sides and wiggled back-and-forth while at the same time applying withdrawing pressure to it.

If a pin connector is bent or misaligned, the next time the burn-in board is used, the misaligned pin may prevent insertion of the board into the test fixture; or the pin may require repair or replacement. The pin connectors have a relatively small diameter, and are somewhat fragile; so that bending or misalignment of the pins can occur when withdrawal of the burn-in board or other test board is effected using these techniques.

It is desirable to provide a device for extracting burn-in boards and other test boards, having large numbers of pin connectors in them, from a test fixture in a simple and effective manner, and which overcomes the disadvantages noted above.

SUMMARY OF THE INVENTION

It is an object of this invention to provide an improved board extractor for removing printed circuit test boards from a test fixture.

It is another object of this invention to provide an improved manually operated board extractor for removing a printed circuit board from a test fixture.

It is a further object of this invention to provide a board extractor for removing a printed circuit board from a test fixture with reduced stress on the pin connectors attached to the edge of the printed circuit board.

In accordance with a preferred embodiment of the invention, a board extractor is designed for use with an integrated circuit test fixture. The extractor is designed to facilitate removal of printed circuit boards from the test fixture, where the test fixture has a number of pin receptacles on the front and the circuit board has a corresponding number of pin connectors attached to one edge for insertion into the pin receptacles on the front of the test fixture. The extractor includes a movable member, which is mounted adjacent the front of the test fixture for engaging a circuit board to move the board from a first position, where the pin connectors of the circuit board are inserted into the pin receptacles of the test fixture, to a second position pushing the circuit board away from the test fixture to remove the pin connectors on the edge of the circuit board from the pin receptacles on the front of the test fixture. An operating member is coupled with the movable member to move it from the first position to the second position.

BRIEF DESCRIPTION OF THE DRAWING

FIG. 1 is a top perspective view of a preferred embodiment of the invention;

FIG. 2A is a partially cut-away side view of the embodiment shown in FIG. 1 in a first position of operation;

FIG. 2B is a partially cut-away side view of the same portion of the embodiment shown in FIG. 2A, but in a different position of operation; and FIGS. 3A and 3B are cross-sectional views taken along the lines 3A—3A and 3B—3B, respectively, of FIGS. 2A and 2B.

DETAILED DESCRIPTION

Reference now should be made to the drawing, in which the same reference numbers are used throughout the different figures to designate the same components. FIG. 1 illustrates a perspective view of a test bench or tester system 9, which is broken away to show the bottom 16 and the front 10 only. The tester 9 includes circuit interconnections for effecting burn-in or other tests of integrated circuits, which are coupled to the tester 9 through a large number of pin receptacles 15 located in rows and columns in a rectangular recess 11 located near the upper side of the front 10 of the tester or test fixture 9.

As is illustrated in FIG. 1, the pin receptacles 15 in the recess 11 are centered in the front 10 of the test fixture 9; but the receptacles could be located to one or the other sides of the center of the front of the test fixture 9, if desired. The test fixture 9 is placed on a base 16 and is oriented to receive a corresponding number of aligned pin connectors 25 in a connector block 21 attached to the leading edge of a printed circuit test board 20. The test board 20 typically is mounted on a frame, with guide rails 26 attached to each side of the printed circuit board 20. The rails 26 extend over the left-hand and right-hand edges of the board 20 and typically are made of metal, while the printed circuit board is made of a non-metal, non-conductive material.

The balance of the tester 9, including the assembly for aligning connector block 21 of the printed circuit board 20 with the recess 11, so that the pins 25 properly enter into and are aligned with the corresponding pin receptacles 15, is not shown in FIG. 1, since these components are standard and are well known. Testers which are made by different manufacturers incorporate the general features which are illustrated. The printed circuit board 20 may be a "burn-in" board, which is to be connected with the test fixture 9 for a length of time suitable to provide an accurate burn-in test of individual integrated circuits, connected at designated areas on the burn-in board. These areas are indicated diagrammatically in FIG. 1 as areas 28. The particular details are not important for an understanding of this invention.

The portion of FIG. 1, which has been described thus far, is conventional and is well known. To facilitate the removal of a burn-in board 20 once the connector pins 25 are fully inserted into the pin receptacles 15 on the test fixture 9, however, a pair of left-hand and right-hand board extractor mechanisms 30 and 40 are provided. In a preferred embodiment of the invention, these mechanisms are attached to the front of the tester 9, and are located on opposite sides of the printed circuit burn-in board 20, as shown most clearly in FIG. 1. The extractors 30 and 40 are attached by means of screws or other suitable fasteners, such as the screws 34, to the base plate 16 of the tester, as illustrated in FIGS. 2A and 2B.

The extractors 30 and 40 are identical in construction. For that reason, only the details of the extractor 30 are shown in FIGS. 2A through 3B. It is to be understood, however, that the structure of the extractor 40 is identical to the one shown in FIGS. 2A to 3B; so that the description of FIGS. 2A through 3B applies equally as well to the structure of the components in the extractor 40.

As illustrated in FIGS. 2A through 3B, the interior of the extractor 30 has a pair of rectangular chambers 31 and 33 in it. The chamber 31 is located toward the rear of the extractor 30 (adjacent the front face 10 of the test fixture 9), and accommodates a bearing 35 and a short internal lever 37. The lever 37 is rigidly attached to a shaft 50, which passes through the bearing 35 and extends across the front 10 of the test fixture 9 above the base 16 and below the recess 11. The shaft 50 also passes through a corresponding bearing 45 on the extractor 40. The shaft 50 causes the components located within both of the extractors 30 and 40 to operate in conjunction with one another. The shaft 50 extends completely through the extractors 30 and 40, and terminates on the outside of both where it is secured to an operating lever 36 for the extractor 30, and a lever 46 for the extractor 40.

The structure which has been described functions so that the operating levers or handles 36 and 46 may be rotated clockwise and counterclockwise to rotate the shaft 50 correspondingly. When this is done, the projection 37 (and a corresponding projection 47 in the block 40) are rotated clockwise and counterclockwise, along with the operating levers 36 and 46, since the levers 36 and 46, as well as the projections 37 and 47 are secured to the shaft 50 for rotation with it.

The rectangular elongated chamber 33 extends from the chamber 31 toward the front of the extractor assembly 30, and opens at the front of the assembly, as shown clearly in FIGS. 1, 2A and 2B. An elongated rectangular bar or slide member 38 is placed in the chamber 33 for reciprocating movement in the chamber 33.

When a printed circuit board, such as a burn-in board 20, is moved to insert the pin connectors 25 into the receptacles 15, guide rails 26 on the opposite edges of the board are seated in front of the slide members 38 and 48 in the position shown in FIGS. 2A and 3A. The front edge of the printed circuit board 20 and the connector block 21 attach to that front edge, pass over the shaft 50; and the connector block 21 is seated in the recess 11 on the front 10 of the test fixture 9.

The depth of the block 21 and the extension or notched edge of the printed circuit board 20 are selected to equal the front-to-back dimension of the extractors 30 and 40, causing the relative locations of the parts to be as illustrated in FIGS. 2A and 3A when the burn-in board 20 is connected to the test fixture 9 for operation. It should be noted that if the slide members 38 and 48 (or either of them) is extended outward (to the right, as viewed in FIGS. 2A through 3B) from the slots or chambers 33, when the board 20 is inserted as described above, the guide rail 26 on each side of the board 20 engages the extended ends of the slide members 38 and 48 and pushes them toward the left (as viewed in all figures), which, in turn, causes the left-hand ends of these members 38 and 48 to push on the lever 37 (for the member 38), rotating the lever 37 (and a corresponding lever 47, not shown, for the member 48) counterclockwise, as viewed in FIGS. 2A and 2B. This raises the operating levers 36 and 46 to the position shown in FIGS. 1, 2A and 3A. Also, as is most apparent in an examination of FIGS. 2A and 3A, the guide rail 26 engages the end of the slide member 38 and no contact between the printed circuit board 20 and the slide member 38 takes place. Also, as shown most clearly in FIGS. 3A and 3B, the inset or notched portions of the printed circuit board 20 are dimensioned to slide past the facing edges of the extractors 30 and 40.

When the test operation is complete and the burn-in board 20 is to be removed, the levers 36 and 46 are pressed downwardly or rotated clockwise (as shown most clearly in FIG. 2B). This causes the lever 37 to rotate clockwise, pushing the left-hand end of the slide member 38 toward the right, as illustrated in FIG. 2B. This causes the slide member 38 to project out of the end of the slot 33, pushing the guide rail 26 of the burn-in board 20 toward the right, as viewed in all figures, to a distance selected to disengage all of the pins 25 from the receptacles 15. The burn-in board 20 then readily may be lifted out of the test fixture 9 and replaced with another test board for subsequent operation with the tester.

It should be noted that since the shaft 50 interconnects the components in both of the extractors 30 and 40, the pressure applied to the guide rails 26 on the edges of the burn-in board 20 is divided, or is substantially equal; so that the board 20 is pushed straight out of the test fixture 9 without any side-to-side movement or wiggling. As a consequence, the likelihood of bending any of the connector pins 25, extending from the connector block 21, is significantly reduced. At the same time, the force multiplication which is effected by the utilization of the relatively long operating levers 36 and 46 permits the extraction of the board 20 to be accomplished with relatively little effort, in contrast to manual prior art techniques.

The foregoing description of the preferred embodiment of the invention should be considered as illustrative, and not as limiting. For example, the relative locations of the connector pins 25 and receptacles 15 could be reversed; so that connector pins extend outward from the front of the test fixture, and receptacles are provided in the block 21. The operation of the extractor mechanism would be the same. In addition, reconfiguration of the mechanisms in the blocks 30 and 40 could be made; so that the lever 37, for example, could be rotated directly to engage the guide rail 26 without requiring the intermediate slide member 38. Various other changes and modifications will occur to those skilled in the art to provide a device which performs substantially the same function, in substantially the same way, to achieve substantially the same result, without departing from the true scope of the invention as defined in the appended claims.

I claim:

1. A board extractor for use with an integrated circuit test fixture for facilitating removal of circuit board from the test fixture, wherein the test fixture has a plurality of pin receptacles on the front thereof and the circuit boards have a corresponding plurality of pin connectors attached to one edge thereof for insertion into the pin receptacles on the front of the test fixture, said board extractor including in combination:

a first slide member mounted on an integrated circuit test fixture adjacent the front thereof for reciprocating movement between the front of said test fixture and a circuit board, said slide member located to engage said one edge of a circuit board and move the circuit board from a first position with the pin connectors of the circuit board inserted into the pin receptacles of the test fixture, to a second position pushing the circuit board away from the test fixture to remove the pin connectors on the one edge of the circuit board from the pin receptacles on the front of the test fixture; and a rotating operating member movable between at least first and second rotatable positions corresponding to said first and second positions of said slide member, said rotating member attached to the test fixture and having a projection thereon for engaging said first slide member to move said slide member from said first position to said second position to effect said reciprocating movement thereof to engage said circuit board.

2. The combination according to claim 1 further including a housing in said test fixture with a channel therein for slideably holding said first slide member for said reciprocating movement therein.

3. The combination according to claim 2 wherein said first slide member is mounted for free reciprocating movement and insertion of the pin connectors of a circuit board into the pin receptacles on the front of said test fixture engages said first slide member and causes said first slide member to be moved to its first position.

4. The combination according to claim 3 further including a second slide member mounted adjacent the front of the test fixture for reciprocating movement between the front of the test fixture and a circuit board, with said first and second slide members located to engage a circuit board at first and second spaced-apart locations, and each of said first and second slide members being movable from a first position with the pin connectors of the circuit board inserted into the pin receptacles of the test fixture to a second position pushing said circuit board away from the test fixture to remove the pin connectors on the one edge of the circuit board from the pin receptacles on the test fixture, wherein said operating member is coupled with said first and second slide members to move said first and second slide members together from the first position thereof to the second position thereof.

5. The combination according to claim 4 wherein said rotating member is mechanically interconnected with said first and second slide members to effect common movement thereof between the first and second positions thereof.

6. The combination according to claim 1 wherein said first slide member is mounted for free reciprocating movement and insertion of the pin connectors of a circuit board into the pin receptacles on the front of said test fixture engages said first slide member and causes said first slide member to be moved to its first position.

7. The combination according to claim 1 further including a second slide member mounted adjacent the front of the test fixture for reciprocating movement between the front of the test fixture and a circuit board, with said first and second slide members located to engage a circuit board at first and second spaced-apart locations, and each of said first and second slide members being movable from a first position with the pin connectors of the circuit board inserted into the pin receptacles of the test fixture to a second position pushing said circuit board away from the test fixture to remove the pin connectors on the one edge of the circuit board from the pin receptacles on the test fixture, wherein said operating member is coupled with said first and second slide members to move said first and second slide members together from the first position thereof to the second position thereof.

8. The combination according to claim 7 wherein said rotating member is mechanically interconnected with said first and second slide members to effect common movement thereof between the first and second positions thereof.

* * * * *